United States Patent [19]

Farag et al.

[11] Patent Number: 4,482,892

[45] Date of Patent: Nov. 13, 1984

[54] CAUTION LAMP FOR HIGH VOLTAGE CONTROLLER

[75] Inventors: Samir F. Farag; John D. Kleinecke, both of Wichita Falls, Tex.

[73] Assignee: Siemens-Allis, Inc., Atlanta, Ga.

[21] Appl. No.: 373,093

[22] Filed: Apr. 28, 1982

[51] Int. Cl.³ ............................................. G08B 23/00
[52] U.S. Cl. .................................... 340/654; 340/644
[58] Field of Search ............... 340/654, 635, 644, 638, 340/639; 318/789, 778

[56] References Cited

U.S. PATENT DOCUMENTS 3,228,018  1/1966  Benjaminsen et al. ......... 340/654 X
3,680,071  7/1972  Burgoon ............................... 340/654

Primary Examiner—Jerry W. Myracle
Attorney, Agent, or Firm—F. W. Powers; J. L. James

[57] ABSTRACT

A warning feature for a high voltage controller or the like. A lamp is mounted on the controller cabinet, and connected to an interlock circuit so as to be illuminated whenever line voltage is being supplied to a contactor assembly, regardless of the open or closed status of the contactor itself.

3 Claims, 3 Drawing Figures

CAUTION LAMP FOR HIGH VOLTAGE CONTROLLER

BACKGROUND OF THE INVENTION

The present invention relates to high voltage motor controllers, and more particularly to a novel safety feature comprising a lamp which is energized to warn of the presence of high voltage within the controller cabinet.

Motor control centers of the high voltage type are ordinarily provided with large, heavy contactors for opening and closing a load circuit, specifically for connecting and disconnecting motors to sources of high voltage. Owing to the size and weight of the contactors utilized for this purpose, the contactors are ordinarily mounted in a withdrawable carriage assembly which is fitted with wheels or rails for ease of removal from within the controller cabinet so that the contactor can be inspected, serviced or replaced with relative ease.

Owing to the high voltages and currents which the contactor is expected to manage considerable attention has been given to the construction of the fixed connections within the cabinet, and the mating connectors on the contactor assembly which engage them. Typically such connections comprise a rigid metal element termed a "stab," and a set of spring-loaded "fingers" which are forced over and tightly grip the stab. Engagement of the contactor assembly with the stabs not only supplies high voltage electricity to the main contactor elements, but also energizes a transformer which in turn supplies lower-voltage power to various control system elements, which are ordinarily mounted upon the contactor carriage assembly.

Because of the heavy, rugged construction of the main contacts, motor controllers are commonly provided with racking mechanisms which engage the contactor carriage assembly and forces it tightly into engagement with the bus bar stabs, completing a circuit from the line power supply to the contactor and from the contactor to the controlled load.

Owing to the high voltage which is then present upon the contactor, it is necessary to prevent ready access to the contactor. This end is ordinarily accomplished by a series of mechanical interlocks which ensure that the door to the contactor cubicle cannot be opened unless the contactor assembly is disengaged, or unracked. Such interlock arrangements are ordinarily provided as part of the racking mechanism, so that when the mechanism is in the "unracked" position, the door can be opened and access gained to the contactor and a technician may safely assume that the contactor is completely deenergized.

In addition to the release of the compartment door as an indication of deenergization, some manufacturers provide other indications that the contactor assembly is unracked. Typically the racking handle is labeled with "On" and "Off" legends signifying racked and unracked positions of the contactor. Still other manufacturers provide mechanical flags or the like which are directly operated by the position of the contactor assembly or the racking mechanism. In all of these instances, however, what is actually signified is the position of the control mechanism, or of the contactor carriage; the actual presence of electrical power upon the contactor assembly is not directly monitored.

The underlying assumption in the various interlock or alarm systems which have historically been used is that the movement or position of certain mechanical elements will necessarily result in the deenergization of the contactor assembly. However the present inventors have noted that many, if not most, serious accidents involving high voltage contactor assemblies result from persons gaining access to the contactor compartment while the contactor assembly is still energized. Such access may occur inadvertently through ignorance, or by deliberately defeating the various mechanical interlocks which have been provided as safety measures. Accordingly, it will be seen that it would be highly desirable to provide a high voltage motor control center with a highly visible indication of presence of electrical power in a high voltage contactor assembly, regardless of status or position of various mechanical elements within its cabinet.

It is therefore an object of the present invention to provide an improved warning system for a high voltage contactor assembly.

Yet another object is to provide highly visible warning means which will indicate the electrical state of a high voltage contactor assembly.

Yet another object is to provide an improved warning mechanism which cannot be defeated by the destruction or overpowering of a racking mechanism.

SUMMARY OF THE INVENTION

Briefly stated, in accordance with one aspect of the invention the foregoing objects are achieved by providing an electrically powered lamp assembly mounted on the outer surface of the control center, where it is immediately noticeable by a technician. A transformer is coupled to the "load" side of power circuit fuses within the contactor assembly, and the lamp connected across the transformer secondary so as to be energized whenever power is present in the contactor assembly. "Start" and "Stop" buttons in series with a master relay are also coupled in parallel with the lamp, and in a preferred embodiment a receptacle for receiving a low test voltage is provided along with switching means which decouple the transformer from the balance of the control circuit so that the test voltage will not energize the transformer primary. Switching means are also provided for decoupling the lamp from the transformer secondary winding and momentarily coupling it across the test voltage receptacle so that operation of the lamp may be checked during a test procedure.

BRIEF DESCRIPTION OF THE DRAWING

While the specification concludes with claims particularly pointing out and distinctly claiming the subject matter which is regarded as the invention, it is believed that the invention will be better understood from the following description of a preferred embodiment taken in conjunction with the accompanying drawings in which:

DESCRIPTION OF A PREFERRED EMBODIMENT

Figure 1:
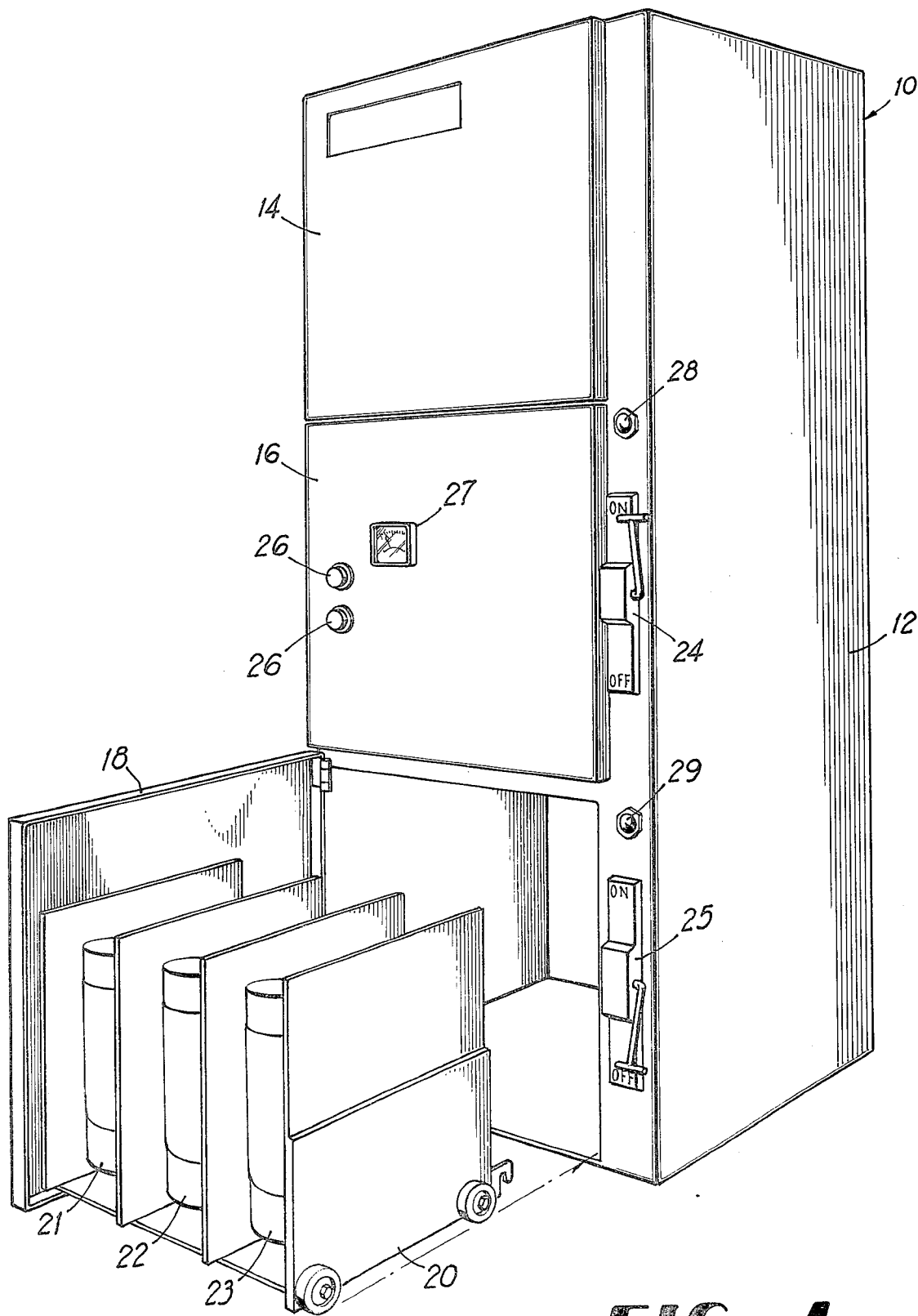
FIG. 1 represents a motor controller, illustrating placement of a warning lamp.

A motor control center of the high-voltage type is generally depicted at 10 of FIG. 1. Such a device includes an inner, steel framework (not visible) covered by sheet metal outer panels 12. The center is typically divided into several vertically-aligned cubicles. In the Figure, the two upper cubicles are enclosed by doors 14, 16 while door 18 of the lowermost cubicle stands open. The electromechanical contactor which forms the principal working mechanism of the controller is carried on a contactor carriage assembly 20, which is commonly provided with wheels as shown for ease of insertion and withdrawal into the controller cubicles. Three fuses, one for each phase, are represented at 21, 22 and 23. When the contactor carriage assembly is fully installed, or racked, in the cubicle fuses may readily be replaced by opening door 18 and manually removing and replacing them.

A pair of handles 24, 25 are disposed on the exterior of the controller and operate internal mechanisms which engage the contactor carriages and rack them firmly against stationary electrical contacts, normally located at the rear of each compartment. The racking mechanism also includes means for latching doors 16, 18 closed so that access to the contactor is prevented when the are in a fully racked position, engaging potentially energized line contacts. By moving the handles to an unracked or "off" position, as shown by handle 25, the carriage assembly is disengaged from the line-voltage contacts and moved outwardly toward the door of the cubicle. Sufficient space is provided within the cubicle to allow this to occur without interfering with the door itself. The door can then be manually opened.

Other apparatus such as control buttons 26 and meter 27 may be installed in the face of the cabinet, as dictated by the user's requirements. In accordance with the present invention, warning lamps 28, 29 are disposed on the frontal surface of the controller cabinet, where they are plainly visible to technicians servicing the equipment.

Figures 2, 3:
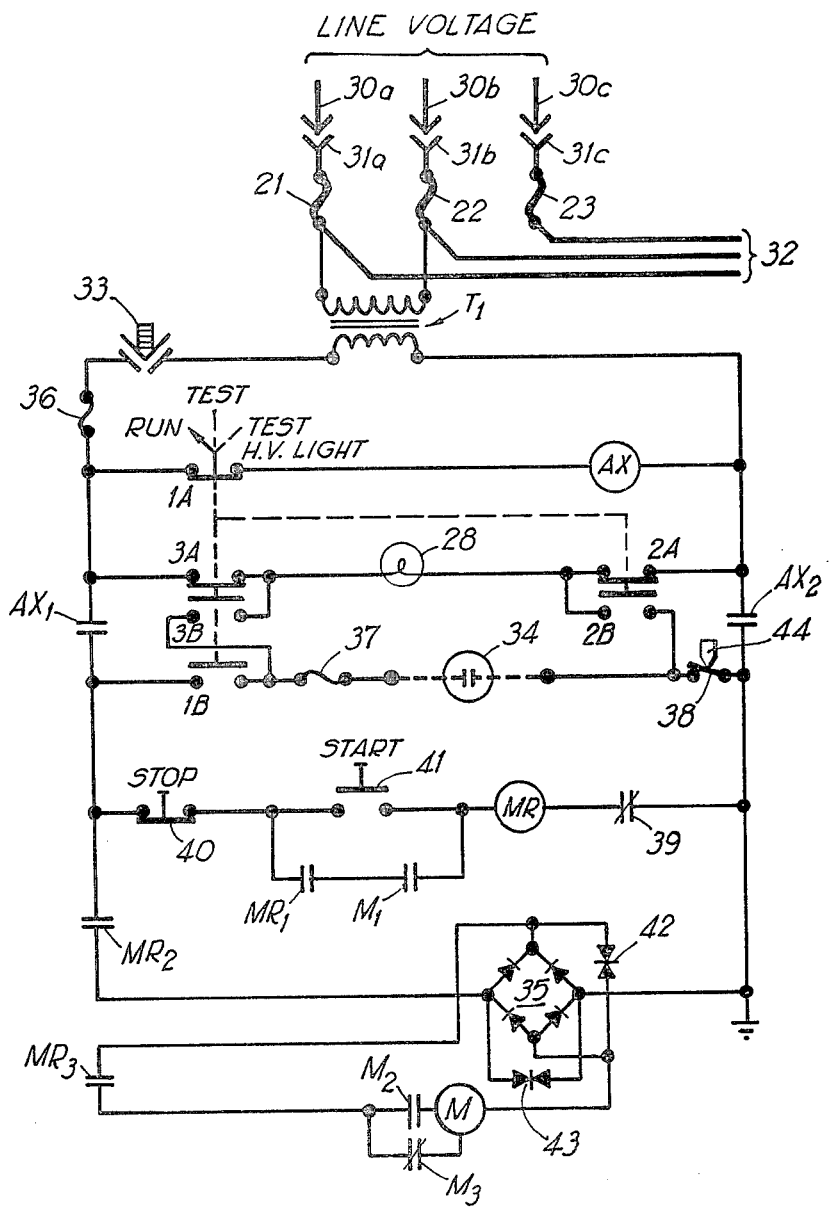
FIG. 2 is a schematic diagram illustrating one embodiment of the invention.
FIG. 3 is a table illustrating the operation of the test switch of FIG. 2.

Turning now to FIG. 2, there is shown a schematic diagram which illustrates the manner of connection and operation of the warning lamps depicted in FIG. 1. As described above, a series of stationary connections $30_a$, $30_b$ and $30_c$ are disposed within each compartment of the control cabinet which is to receive a contactor assembly. Mating connectors $31_a$, $31_b$ and $31_c$ is provided on the confronting part of the carriage assembly so that the connectors mesh as the carriage assembly is racked in place. Current from the phases flows through fuses 21, 22 and 23 to heavy conductors 32 which are connected to the contacts of the main contactor. Other connectors engage fixed contacts which are coupled to load buses, so that when closed the contactor allows current to flow to a load.

Coupled to the load side of fuses 21, 22 is the primary winding of a step-down transformer $T_1$. The lower-voltage secondary winding is connected to the parallel combination of the winding of an auxiliary relay AX, warning lamp 28, test power receptacle 34, master relay winding MR, and rectifier 35. A fuse 36 is placed in series with the control circuit. Contacts $1_A$ couple the auxiliary relay winding across the secondary of transformer $T_1$, and contacts $2_A$ and $3_A$ do the same for warning lamp 28. Auxiliary relay contacts $AX_1$ and $AX_2$ decouple the balance of the control circuit from the secondary winding of transformer $T_1$ as will be explained hereinafter. Contact $1_B$, along with fuse 37, couple test power receptacle 34 across the circuit through normally-closed racking switch 38 which, in a fully racked position is engaged by stationary pin 44.

Contacts $2_B$ and $3_B$ serve to connect warning lamp 28 across test power receptacle 34.

Main relay coil MR is connected across the circuit through normally-closed overload relay contacts 39, and through a normally-closed "Stop" pushbutton 40 and normally-open "Start" pushbutton 41. The start pushbutton is shunted by master relay contacts $MR_1$ and main relay contacts $M_1$. In addition, master relay contacts $MR_2$ are placed in series with rectifier 35.

The rectifier takes the form of a standard diode bridge for full-wave rectification of current flowing from the secondary winding of transformer $T_1$. The bridge is shunted by surge protectors 42, 43 which comprise metal oxide nonlinear resistors. The diode bridge supplies current to the windings M of the main contactor of the system, which is provided with three sets of contacts (not shown) coupled in series with conductors 32 for opening and closing the load circuit. In addition, auxiliary contacts $M_2$ and $M_3$ couple the "run" and "start" windings of the main contactor M to the diode bridge. An additional master relay contact $MR_3$ is placed in series between the rectifier and windings of main contactor M.

When the contactor carriage assembly is installed in its cubicle and handle 25 raised, the racking mechanism within the cubicle engages the carriage and forces it firmly against stabs $30_a$–$30_c$ at the back of the cubicle. At the same time other stabs (not shown) are engaged to electrically connect the contactor assembly with a load, such as an electric motor. It will now be seen that line voltage is impressed upon connections $31_a$–$31_c$, and line-to-line voltage appears between the load sides of fuses 21, 22 and 23. Accordingly the primary winding of transfer $T_1$ begins to draw current and a lower voltage, ordinarily 115 or 230 volts, arises across the secondary winding of the transformer.

In the process of fully racking the transformer, interlock 33 is also engaged by mating contacts in the control circuit, as shown in FIG. 2. While such an interlock may be comprised of a pressure-sensitive switch or the like in a presently preferred embodiment it is formed of a conductive member which bridges a set of contacts in the control circuit, the conductive member being supported by a block of insulation material. Also upon racking, normally-closed switch 38 is opened by engagement with pin 44. Current from the secondary transformer $T_1$ now flows through fuse 36. With the manual switch in the "Run" position, as shown in FIG. 2, the secondary voltage is impressed across the winding of auxiliary relay AX, and accordingly current flows through winding AX causing contacts $AX_1$ and $AX_2$ to close. At the same time the voltage causes warning lamp 28 to be energized, indicating the presence of line voltage.

With the AX relay contacts closed the start/stop circuit leg, in the instance shown arising across the terminals of the start pushbutton 41. In the absence of a sensed overload current in the load system, the contacts of overload relay 39 remain closed.

When it is desired to apply current to the controlled load start button 41 is depressed, energizing master relay winding MR. This causes contacts $MR_1$, $MR_2$ and $MR_3$ to close. The closure of contacts $MR_2$ applies current to rectifier 35, which in turn energizes the winding of main contactor M through contacts $M_1$, $M_2$ and $MR_3$ close. The closure of contacts $MR_1$ and $M_1$ effectively latches on the winding of master relay MR after start button 41 is released. The closure of contacts $M_2$ allows current to flow through the "run" winding of contactor M, while the opening of contacts M₃ disables the "start" or "closing" winding in the conventional manner. The main contacts thus remain closed, applying current to the controlled load.

It will now be appreciated that the warning lamp remains on during the operation of other portions of the control circuit, indicating the presence of voltage within the controller cubicle. If the main contacts are released by the opening of the stop button 40, the lamp remains on because of the continued energization of transformer T₁.

It will be appreciated that lamp 28 must exhibit a high degree of reliability. This can be achieved by utilizing an accessory lighting system which incorporates a step-down transformer for operating the bulb at less than its rated voltage. For example, in a presently preferred embodiment a 6.3 volt bulb was utilized in the lamp, while the transformer stepped down the control voltage from 115 (or 230) to 5 volts, rather than 6.3 volts. The lowered voltage, while causing the bulb to burn slightly less brightly, greatly extends the anticipated life time of the bulb so that the chances of failure of a given bulb are extremely remote.

In a presently preferred embodiment means are provided for testing the control circuit when the contactor is not in use. A voltage of 115 or 230 volts is applied to receptacle 34 by means such as an ordinary lead. This impresses a relatively low voltage upon the circuit. In the event that the contactor is still in a "racked" position racking switch interlock 38 will be open, preventing the application of the test power to the transformer T₁. This is particularly important inasmuch as with a secondary winding of the transformer energized, the unit acts as a step-up transformer and will produce a voltage at the load side of fuses 21, 22 which approximates ordinary line voltage, which could be in the range of 4600 volts. In order to connect receptacle 34 into the control circuit, the TEST switch is depressed to the "Test" position changing the position of the contacts to that indicated in the "Test" column of the table of FIG. 3. This allows operation of master relay winding MR and main relay M in order to test the control and operating mechanism of the contactor.

A separate momentary position of the test switch and the "Test HV Light" position allows the operator to temporarily open contacts 2ₐ, 3ₐ and close contacts 2ᵦ, 3ᵦ so that the warning lamp is placed across the test power receptacle 34. This allows the operation of the lamp to be checked without applying voltage to the secondary winding of the control transformer T₁ or causing a voltage to arise across the open contacts of interlock switch 33.

When the contactor carriage assembly is in position in its compartment, and racked into place so that the line voltage stabs make contact with the carriage assembly connectors, illumination of warning lamp 28 provides a clear and readily visible indication of the presence of high voltage in the contactor cubicle. Ordinarily this may be inferred from the "On" position of the racking handle. However, in the event that the racking mechanism is damaged or overpowered and the handle pushed to its lowermost or "Off" position the continued illumination of the warning lamp serves to make a technician or service person aware of the continued presence of high voltage in the cubicle. In like manner, should the door interlock(s) be mechanically overpowered, or the door "sprung" or distorted and forced open in order to gain access to the cubicle, the lamp provides a continued and noticeable warning of the presence of high voltage, not only to the person who has gained access to the compartment but to others who may arrive later and assume that the gear within the opened compartment is deenergized.

It will now be recognized that the present invention comprises a direct, electrical indication of the presence of high voltage within a contactor compartment rather than simply providing an indication of the status of the mechanical devices which locate the contactor assembly carriage. Such a warning light system continues to function even in the presence of a mechanical malfunction, or overpowering, of interlocking and/or racking systems and thereby provides a true, highly visible indication of the energized state of the system which is extremely difficult to ignore.

As will be evident from the foregoing description, certain aspects of the invention are not limited to the particular details of the examples illustrated, and it is therefore contemplated that other modifications or applications will occur to those skilled in the art. It is accordingly intended that the appended claims shall cover all such modifications and applications as do not depart from the true spirit and scope of the invention.

What is claimed as new and desired to be secured by Letters Patent of the United States is:

1. In a motor control center or the like including an electromagnetic contactor having contacts and a winding and including a plurality of fixed connections adapted to be coupled to a source of first, line voltage and a withdrawable contactor assembly including second connection means for engaging said fixed connections to thereby energize said contactor assembly, means for providing a visible indication of the energized state of the contactor assembly comprising;
   a lamp mounted to the outer surface of said control center;
   a transformer disposed within the control center and coupled to at least one of said second connection means for deriving a second, lower voltage from said first, line voltage when said contactor assembly is disposed within said motor control center and said second connections engage said first, fixed connections;
   means electrically coupling said lamp to said transformer; and
   switch means electrically coupled across said transformer for energizing said electromagnetic contactor winding;
   whereby said light is energized when said second connection means engage said first connection means, and power is made available for energizing said contactor winding.

2. The invention defined in claim 1, wherein said motor control center is provided with three of said second connection means for deriving three-phase power for said center;
   three sets of fuses having a source end coupled to ones of said second connection means, and a load end for supplying power to a load,
   wherein the primary winding of said transformer is coupled between the load ends of two of said fuses.

3. The invention defined in claim 1, wherein said contactor includes a receptacle for receiving electric power at substantially the same voltage as produced by said secondary winding of said transformer;

switch means for decoupling said receptacle from said secondary winding to prevent applied power from energizing said transformer;
said lamp being connected between said transformer and said switch means; and
second switch means for decoupling said lamp from said transformer and connecting said lamp across said receptacle whereby said lamp is energized by power applied to said receptacle.

* * * * *